United States Patent
Wang et al.

(10) Patent No.: US 6,492,240 B1
(45) Date of Patent: Dec. 10, 2002

(54) METHOD FOR FORMING IMPROVED HIGH RESISTANCE RESISTOR BY TREATING THE SURFACE OF POLYSILICON LAYER

(75) Inventors: Shyan-Yhu Wang, Taichung (TW); Kun-Lin Wu, Chu-Tung Chen (TW)

(73) Assignee: United Microelectronics Corp. (TW)

( * ) Notice: Subject to any disclaimer, the term of this patent is extended or adjusted under 35 U.S.C. 154(b) by 62 days.

(21) Appl. No.: 09/661,701

(22) Filed: Sep. 14, 2000

(51) Int. Cl.$^7$ ............................................. H01L 21/20
(52) U.S. Cl. .................. 438/382; 438/763; 438/764; 438/793; 438/384
(58) Field of Search ....................... 438/763–793, 438/382, 384

(56) References Cited

U.S. PATENT DOCUMENTS

| | | | |
|---|---|---|---|
| 5,849,627 A | * 12/1998 | Linn et al. | 438/455 |
| 5,939,763 A | * 8/1999 | Hao et al. | 257/411 |
| 6,008,120 A | * 12/1999 | Lee | 438/634 |
| 6,069,063 A | * 5/2000 | Chang et al. | 438/528 |
| 6,114,258 A | * 9/2000 | Miner et al. | 438/787 |
| 6,245,616 B1 | * 1/2001 | Buchanan et al. | 438/287 |
| 6,222,256 B1 | * 4/2001 | Matsuura et al. | 257/640 |

FOREIGN PATENT DOCUMENTS

| | | | | |
|---|---|---|---|---|
| JP | 363246830 A | * 10/1988 | | H01L/21/314 |
| JP | 402035769 A | * 2/1990 | | H01L/27/10 |

* cited by examiner

Primary Examiner—Matthew Smith
Assistant Examiner—Renzo N. Rocchegiani
(74) Attorney, Agent, or Firm—Powell Goldstein Frazer & Murphy LLP

(57) ABSTRACT

Performance of the high resistance resistor, which is polysilicon, is improved by treating the surface of the polysilicon layer in mixed signal integrated circuits for ADSL (Asymmetric Digital Subscriber Line) broadband service application. This treated surface of the polysilicon layer will prevent ions in the resistor from out-diffusion when performing an annealing step after forming the resistor.

27 Claims, 9 Drawing Sheets

METHOD FOR FORMING IMPROVED HIGH RESISTANCE RESISTOR BY TREATING THE SURFACE OF POLYSILICON LAYER

BACKGROUND OF THE INVENTION

1. Field of the Invention

This invention generally relates to a method for forming a high resistance resistor in mixed signal integrated circuits (IC), and more particularly to a method for forming mixed signal IC with improved high resistance resistor by treating the surface of polysilicon layer.

2. Description of the Prior Art

Because resistors, particularly high resistance resistors, integrated into mixed signal IC (integrated circuits) are usually used in telecommunication applications, they have been used in the mixed signal IC for ADSL (Asymmetric Digital Subscriber Line) broadband service application in recent decades. The high resistance resistors can reduce power consumption in a standby state of the devices used in broadband applications.

A conventional method for forming the high resistance resistor in mixed signal IC is performed by implanting low dosage ions into polysilicon, and is set forth below and explained by reference to FIGS. 1A to 1H.

Referring to FIG. 1A, a substrate 110 is provided with a P well 111 and an N well 112 formed therein. An isolation region 115 is formed by a conventional CVD (Chemical Vapor Deposition) process, as is shown in FIG. 1B. A portion of this polysilicon layer 120 is used for the bottom electrode of the capacitor on the isolation region 15 and another portion is used for the resistor on the N well 112.

Then, a polysilicon layer 120 is deposited on the substrate 110 using a conventional CVD (Chemical Vapor Deposition) process, as is shown in FIG. 1B. A portion of this polysilicon layer 120 is used for the bottom electrode of the capacitor on the isolation region 15 and another portion is used for the resistor on the N well 112.

Next, referring to FIG. 1C, a blanket ion-implantation 130 is performed to adjust the resistance of the polysilicon layer 120. The implanted dopants may be phosphorous or boron. Because high resistance is needed in the circuits, the doping dosage of this implantation is relatively low compared with the electrode of the capacitor.

Referring to FIG. 1D, a resistor patterned photoresist layer 140 is formed on the polysilicon layer 120 to block the following blank implantation 131 step. Because this implantation step 131 is used to reduce resistance of the bottom electrode of the capacitor, the patterned photoresist layer 140 is used to prevent the resistor region in polysilicon layer 120 from the implantation 131.

Then the patterned photoresist layer 140 is stripped, and the polysilicon layer 120 is annealed, as shown in FIG. 1E. The annealing step follows the above implantation steps 130 and 131 such that dopants in the polysilicon layer 120 can diffuse uniformly, and the photoresist layer 140 has to be stripped before annealing.

Having finished the annealing step, a second photoresist layer 141 is deposited on the polysilicon layer 120, as shown in FIG. 1F. This photoresist layer 141 comprises two patterns, which one is resistor pattern over the N well 112 and another is bottom electrode pattern over the isolation region 115. Then, the polysilicon layer 120 is etched by using the photoresist layer 141 as a mask to form a resistor 121 and a bottom electrode 123 of a capacitor, as shown in FIG. 1G.

Referring to FIG. 1H, having finished the resistor 121, a dielectric layer 118 and another polysilicon layer 125 are sequentially deposited on the bottom electrode 123 to form a capacitor. Moreover, a metal-oxide-semiconductor transistor 150 is formed in and on the P well 111. The transistor 150 comprises source/drain regions 151, source/drain extension regions 152, a poly gate electrode 153, a gate oxide layer 154, and spacers 155.

However, both out diffusion generated in the step of FIG. 1E or over-deepened implantation generated in the step of FIG. 1C reduce the resistor's quality and reliability.

SUMMARY OF THE INVENTION

In accordance with the present invention, a main object of this method is to form an improved high resistance resistor in mixed signal integrated circuits that substantially increases reliability and quality during the formulation of the resistor.

It is another object of this invention that the treated surface polysilicon layer prevents diffusion in the annealing step to obtain reliable resistor.

It is a further object of this invention the treated surface polysilicon layer prevents over-deepened implantation.

In one embodiment, a method for forming a high resistance resistor in mixed signal integrated circuits is provided. The method includes first providing a substrate. Then, a polysilicon layer is deposited on the substrate. As a key step of this invention, the surface of the polysilicon layer is treated using a plurality of gases to form a diffusion barrier layer on the polysilicon layer, wherein the gases comprise $N_2O$, $O_2$, $NO$, and $N_2$. In this invention, two methods for forming this amorphous layer are provided, including one using a plasma treatment, and another using a rapid thermal process (RTP). Then, ions are implanted into the polysilicon layer to adjust the resistance of the polysilicon layer. Next, the polysilicon layer is annealed, and the polysilicon layer is patterned to form the resistor on the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Moreover, while the present invention is illustrated by a number of preferred embodiments directed to silicon semiconductor devices, it is not intended that these illustrations be a limitation on the scope or applicability of the present invention. Further, while the illustrative examples use insulated gate control structures, it should be recognized that the insulated gate portions may be replaced with light activated or current activated structure(s). Thus, it is not intended that the semiconductor devices of the present invention be limited to the structures illustrated. These devices are included to demonstrate the utility and application of the present invention to presently preferred embodiments.

Further, various parts of the semiconductor elements have not been drawn to scale. Certain dimensions have been exaggerated in relation to other dimensions in order to provide a clearer illustration and understanding of the present invention. For the purposes of illustration the preferred embodiment of the semiconductor devices of the present invention have been shown to include specific P and N type regions, but it should be clearly understood that the teachings herein are equally applicable to semiconductor devices in which the conductivities of the various regions have been reversed, for example, to provide the dual of the illustrated device. Enhancement and depletion mode structures may be similarly interchanged.

Further, although the embodiments illustrated herein are shown in two dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

Figure 1A:
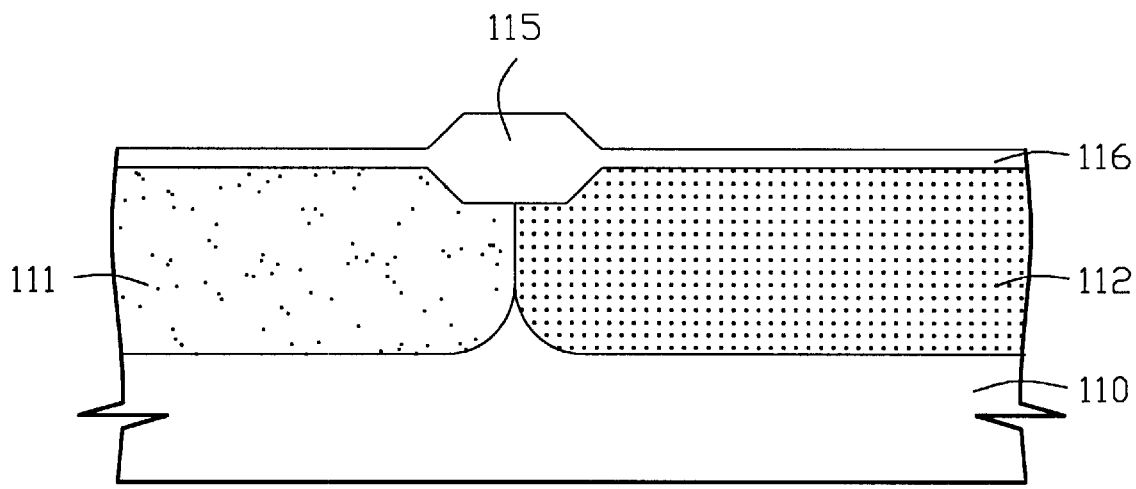
FIGS. 1A to 1H are schematic representations of structures at various stages during the formulation of mixed signal integrated circuits using conventional, prior art techniques.
Figure 1B:
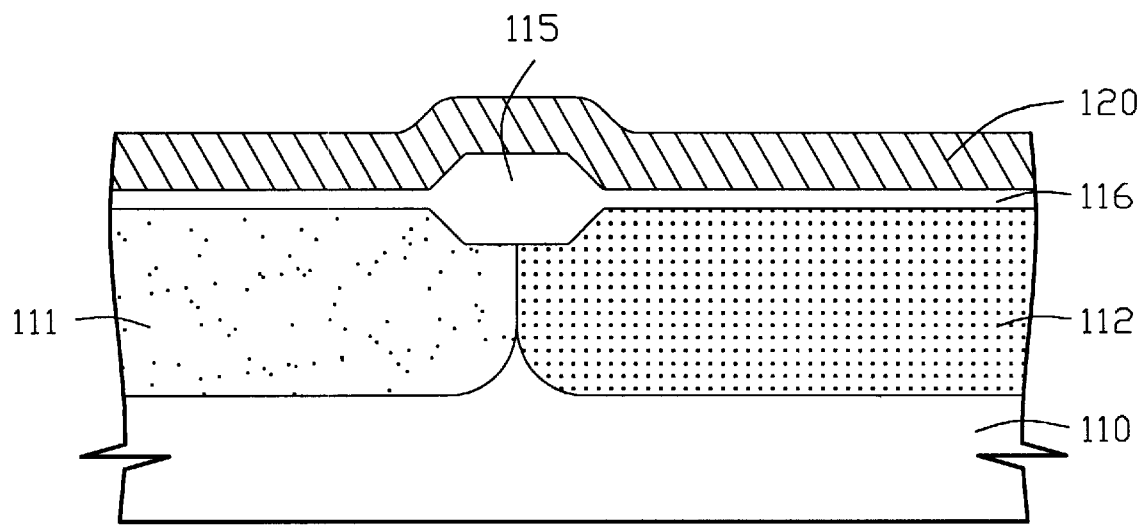
Figure 1C:
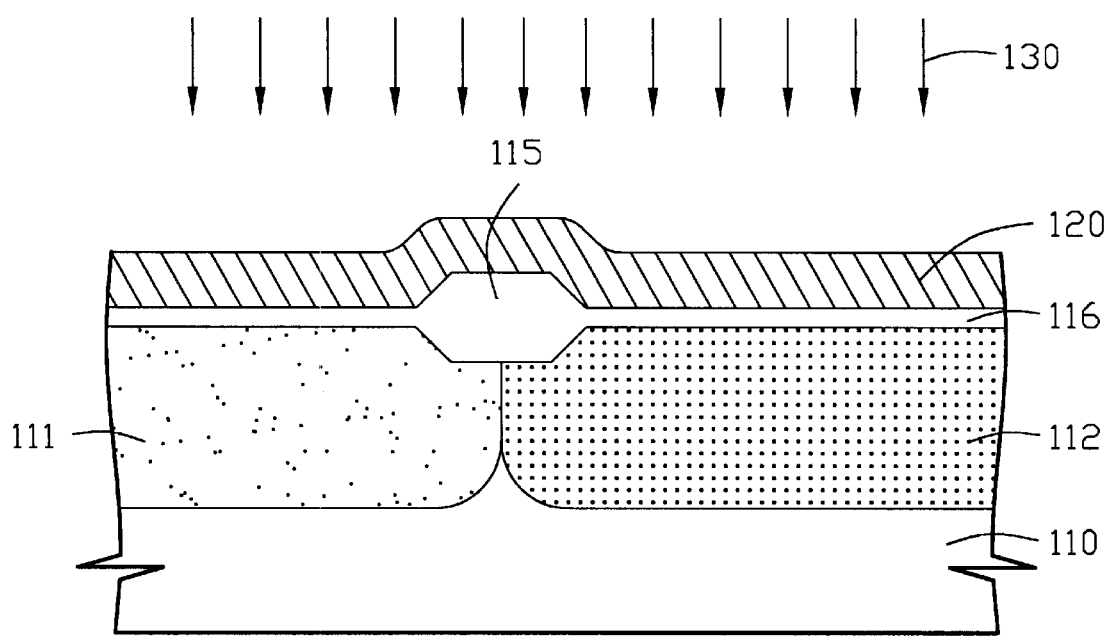
Figure 1D:
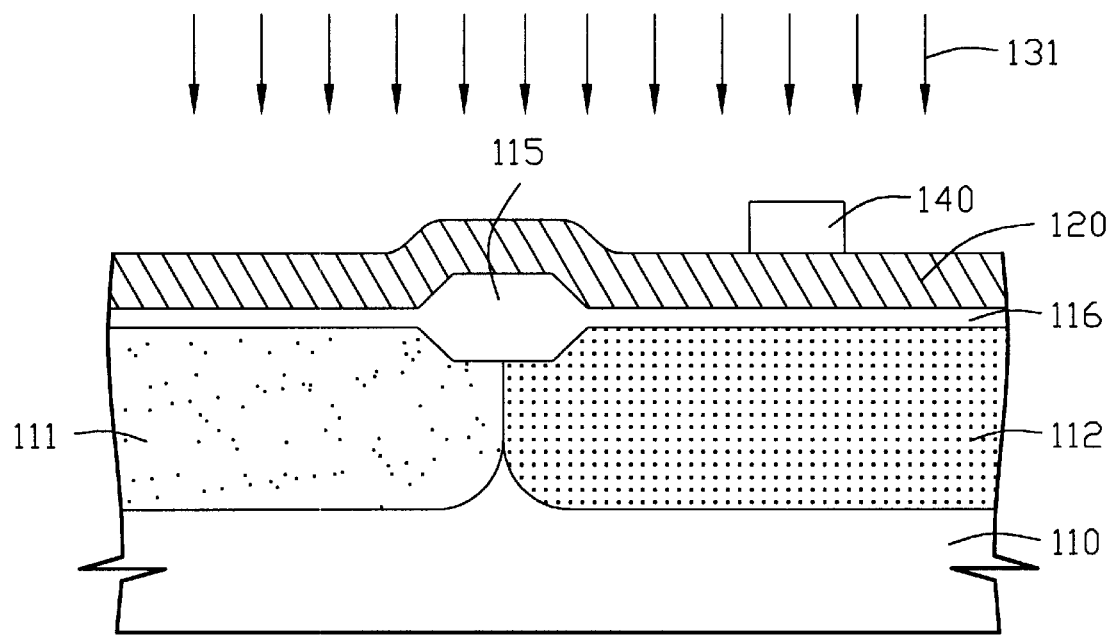
Figure 1E:
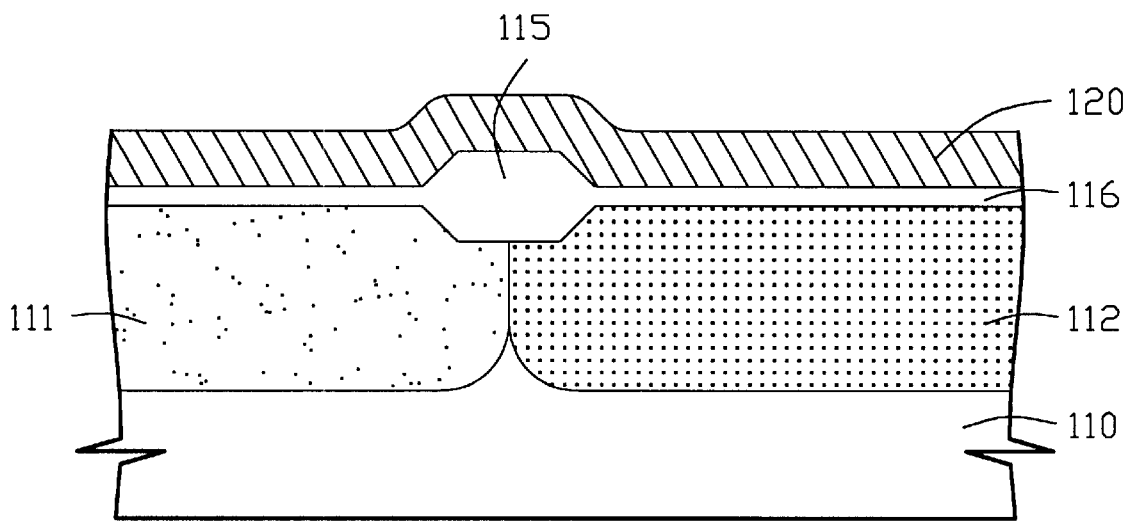
Figure 1F:
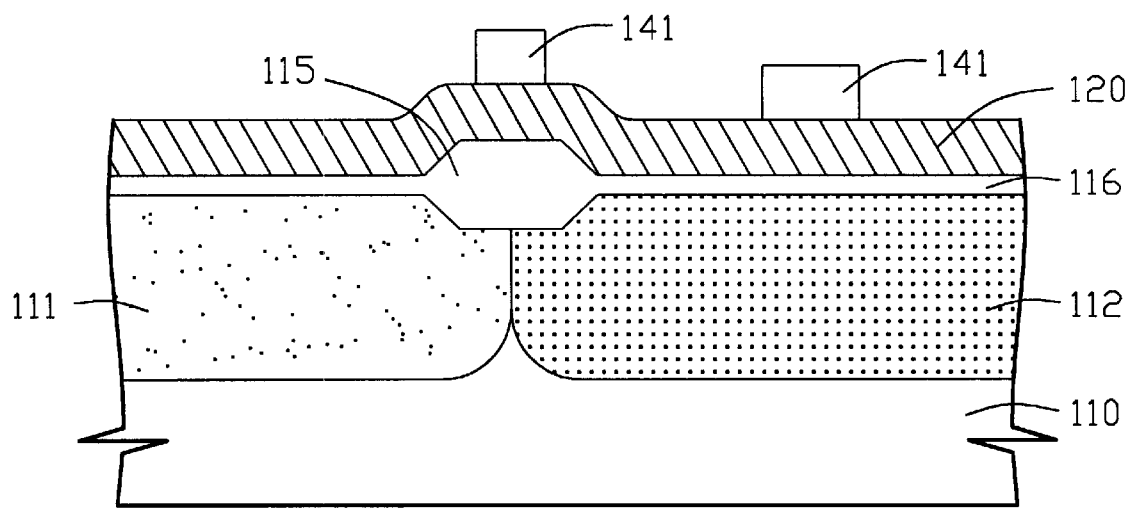
Figure 1G:
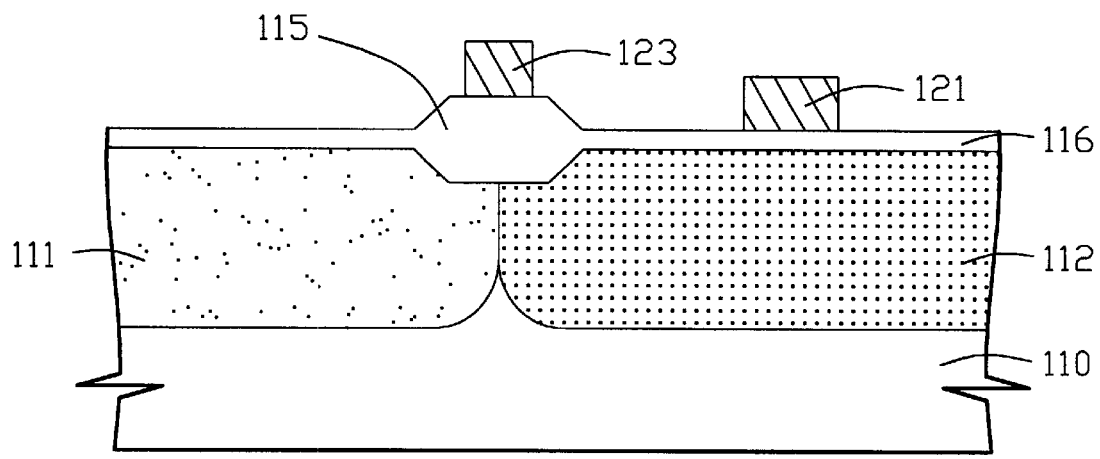
Figure 1H:
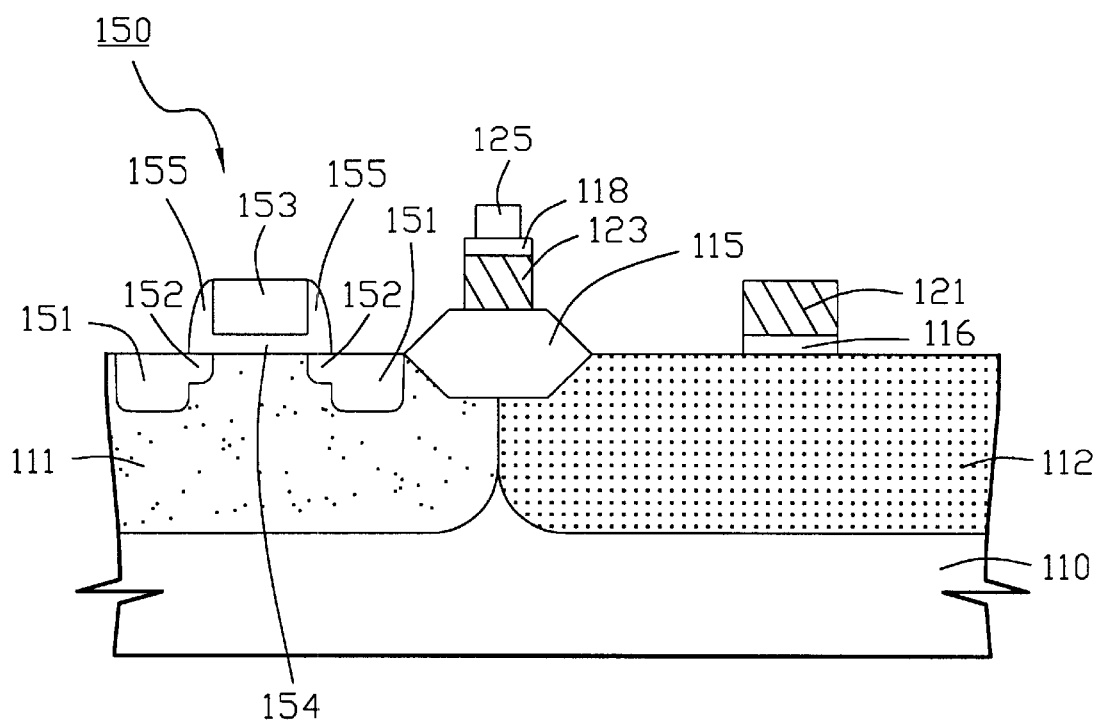
Figure 2:
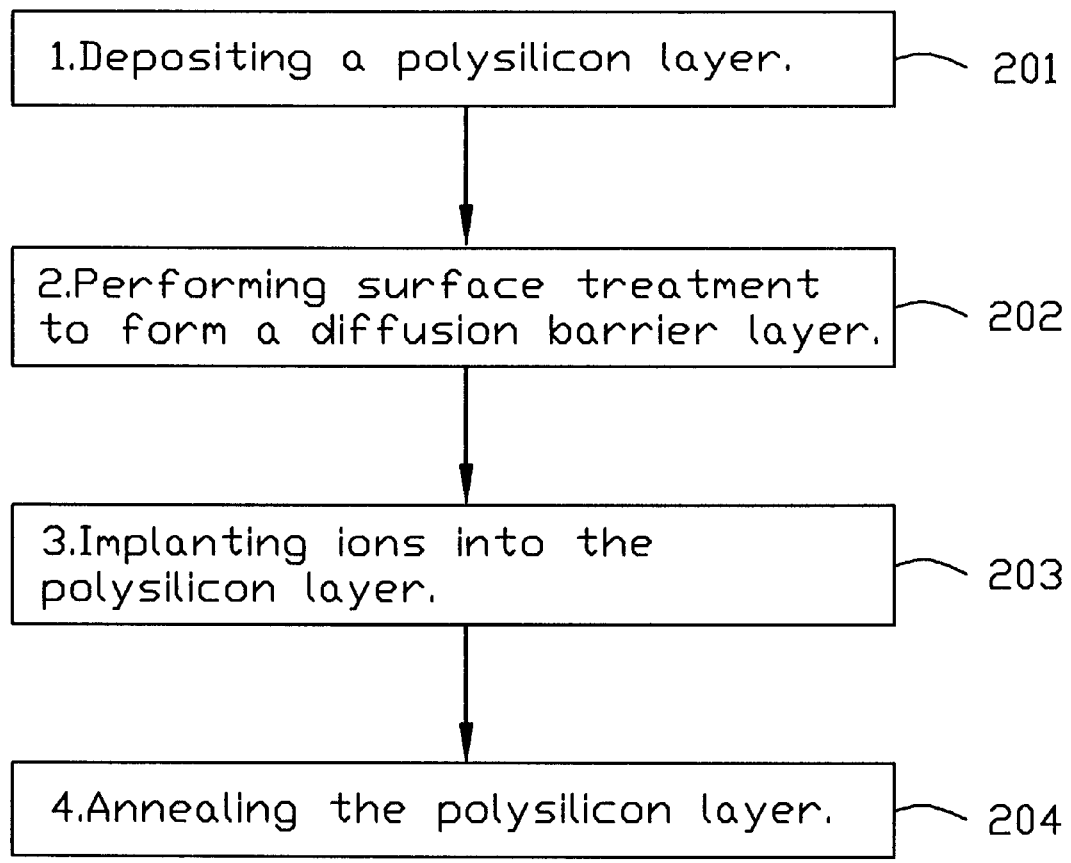
FIG. 2 is a flow diagram showing the steps for forming a mixed signal integrated circuit in accordance with a method disclosed herein.

In this invention, the improved high resistance resistor is formed by treating the surface of a polysilicon layer. FIG. 2 is a flow diagram summarizing the steps in one method of forming a high resistance resistor in mixed signal integrated circuits in accordance with this disclosure. First, a polysilicon layer is deposited on a substrate (step 201). This polysilicon layer is used for the resistor and bottom electrode of a capacitor. Then, as a key step of this invention, the surface of polysilicon layer is treated by using a plurality of gases to form a diffusion barrier layer on the polysilicon layer, wherein the gases comprise $N_2O$, $O_2$, NO, and $N_2$ (step 202). In this invention, two methods for forming this amorphous layer are provided, in which one is using plasma treatment, and another is using rapid thermal process (RTP). Next, ions are implanted into the polysilicon layer to regulate the resistance of the polysilicon layer (step 203). Finally, the polysilicon layer is annealed that the ions diffuse uniformly (step 204). Suitable conditions for performing the various steps set forth in FIG. 2 are set forth below and will be explained by reference to FIGS. 3A to 3G.

Figure 3A:
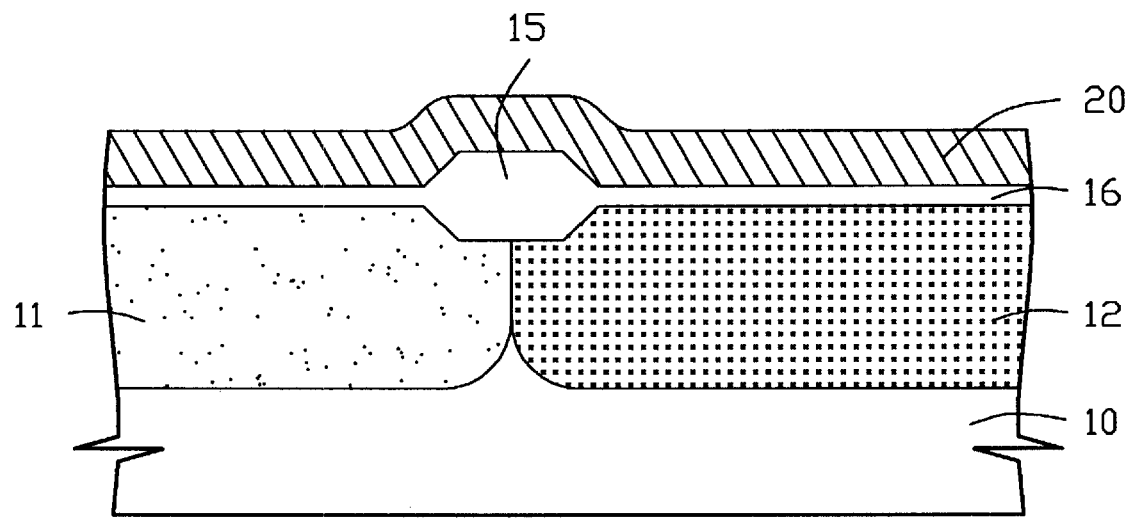
FIGS. 3A to 3G are schematic representations of structures at various stages during the formulation of a mixed signal integrated circuit in accordance with a method disclosed.

Referring to FIG. 3A, a substrate 10 is provided with an isolation region 15 formed thereon. The isolation region 15 is in order to isolate an N well 12 and a P well 11 formed in the substrate 10. The isolation region 15, in this embodiment, is field oxide (FOX) formed by LOCOS process, and can be STI (shallow trench isolation). A silicon oxide layer 16, as a sacrificial oxide layer, is formed on the substrate 10 by using conventional thermal oxidation method. A polysilicon layer 20 is deposited on the substrate 10 by using any conventional chemical vapor deposition (CVD) method.

Figure 3B:
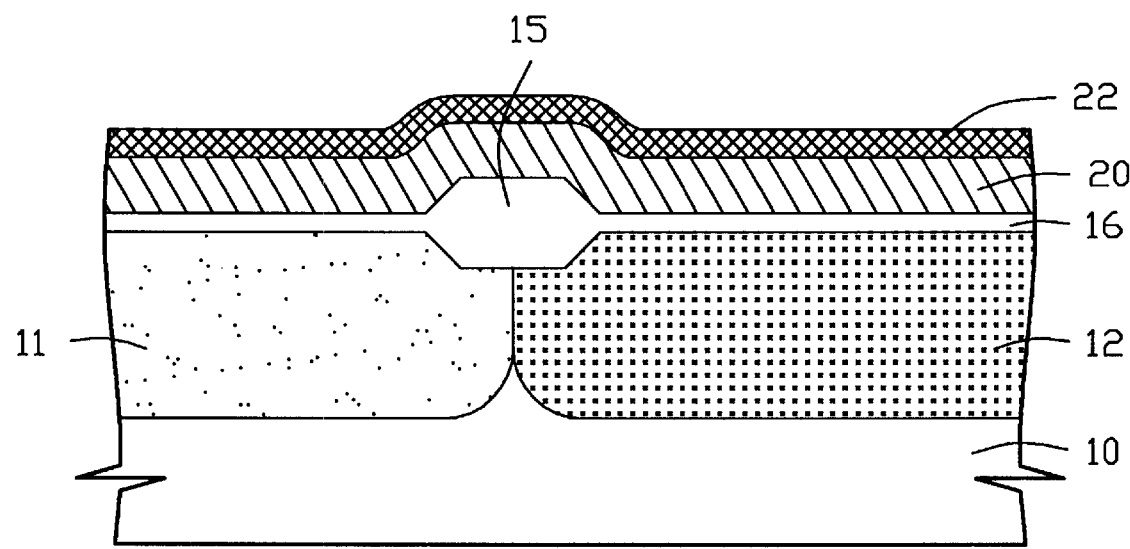

Referring to FIG. 3B, as a key step of this invention, a diffusion barrier layer 22 is formed on the surface of the polysilicon layer 20 by performing surface treatment. Two methods for forming this diffusion barrier layer are provided in this invention. The first method is using RTP within $N_2O$, $O_2$, NO, and $N_2$. The first method is to put a wafer into the furnace to be heated between about 600° C. to 800° C., and the heating duration is between about 300 to 600 seconds. The second method is using plasma treatment within $N_2O$, $O_2$, NO, and $N_2$. Both methods cause the formation of a thin amorphous nitride layer or amorphous oxide layer as the diffusion barrier layer 22 on the polysilicon layer 20, and the thickness of this barrier layer is between about 300 to 500 Angstrom.

Figure 3C:
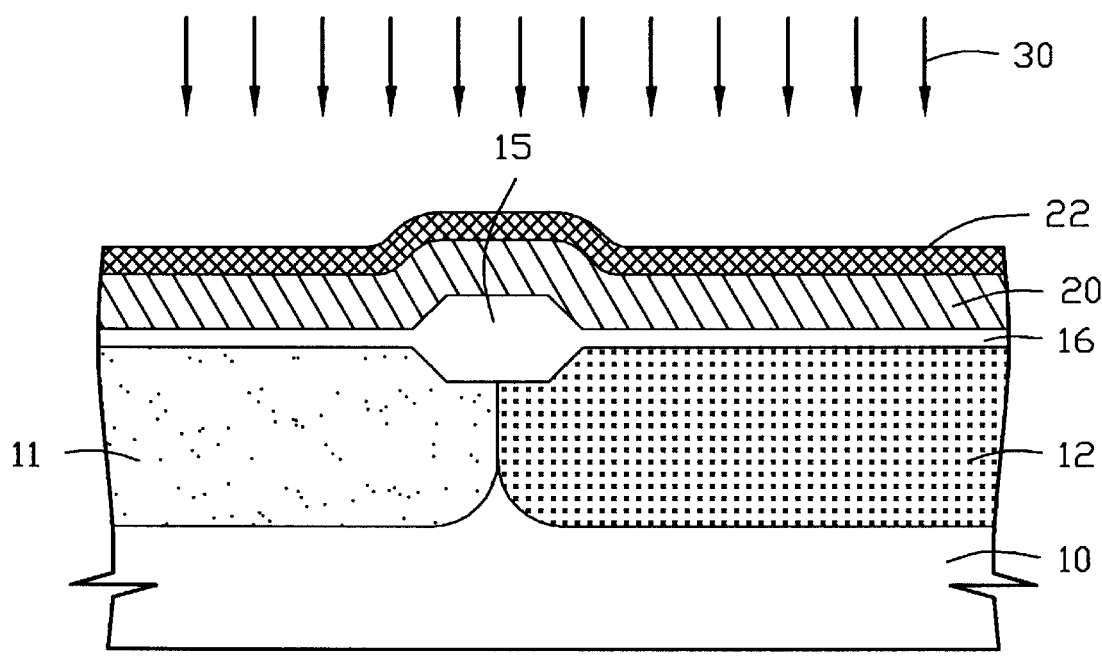

Referring to FIG. 3C, an ion-implantation 30, which dopes dopants into the polysilicon layer 20, is performed to regulate the resistance of the polysilicon layer 20. The diffusion barrier layer 22 in this implantation step 30 is used as a pad layer to prevent from channel effect such that over-deepened implantation will not occur. In this embodiment, the implantation step 30 utilizes phosphorous or boron as dopants, and the energy of this implantation 30 is between about $\leq 40$ Kev. The dosage of the dopants, which is used to adjust the resistance of the polysilicon layer 20, is between about $\leq 5E15$ in this embodiment.

Figure 3D:
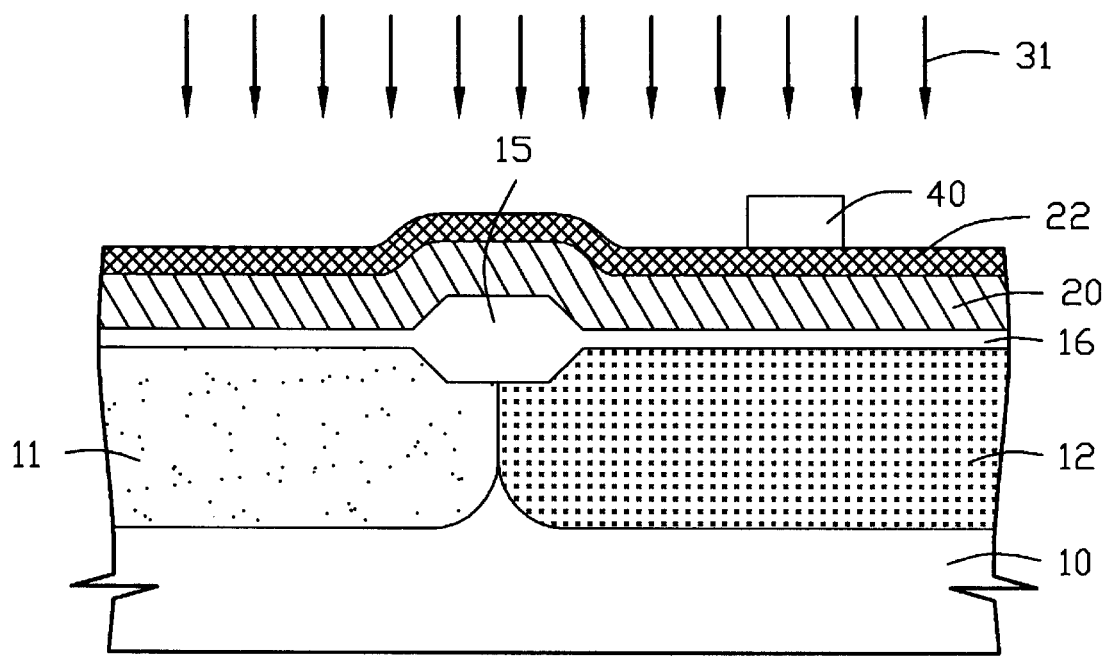

Referring to FIG. 3D, a patterned photoresist layer 40 is deposited on the diffusion barrier layer 22. This photoresist layer 40 is used to keep high resistance of a resistor formed thereafter. Hence, the polysilicon layer 20 below the patterned photoresist layer 40 is the resistor for mixed signal integrated circuits in this embodiment. The patterned photoresist layer 40 is formed by conventional lithography process comprising coating, exposing, and developing steps.

Then, an ion-implantation 31, which dopes dopants into the polysilicon layer 20, is performed again. The diffusion barrier layer 22 in this implantation step 30 is used again as a pad layer to prevent from channel effect such that over-deepened implantation will not occur. This implantation step 31 is used to regulate the resistance of bottom electrode of a capacitor. Because the photoresist layer 40 blocks a portion of the polysilicon layer 20, which will be a resistor, this region of the polysilicon layer 20 can maintain high resistance. In this embodiment, the implantation step 30 utilizes phosphorous or boron as dopants, and the energy of this implantation 30 is between about 30 to 40 Kev. The dosage of the dopants is between about 1E15 to 1E16 in this embodiment.

Figure 3E:
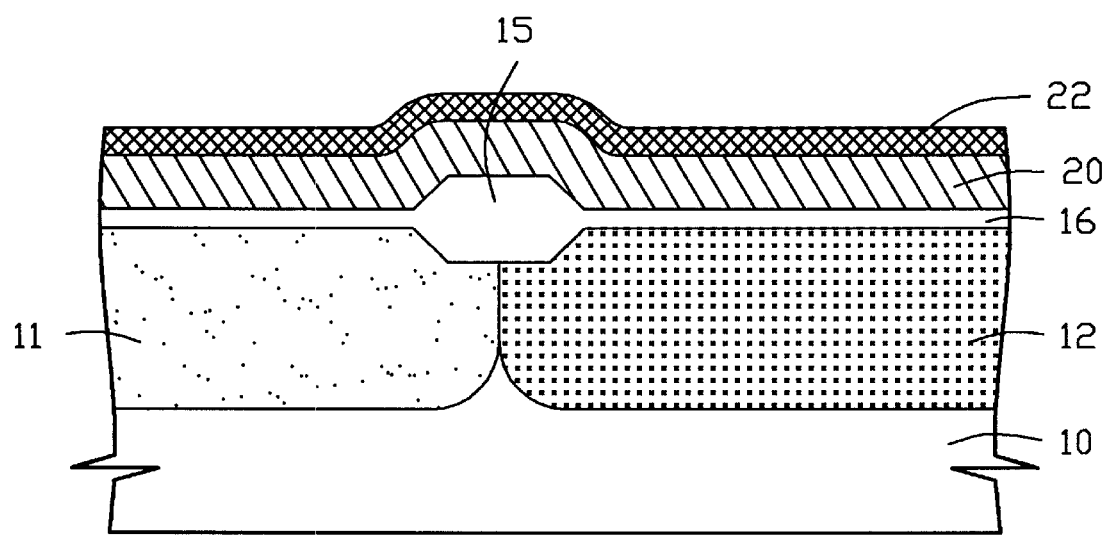

Referring to FIG. 3E, the whole wafer is then placed into furnace to anneal the polysilicon layer 20 after the photoresist layer 40 in FIG. 3D is stripped. This annealing step will make dopants in the polysilicon layer 20 diffuse uniformly, and the diffusion barrier layer 22, as an out-diffusion barrier layer, simultaneously prevents from out-diffusion along poly grain boundary.

Figure 3F:
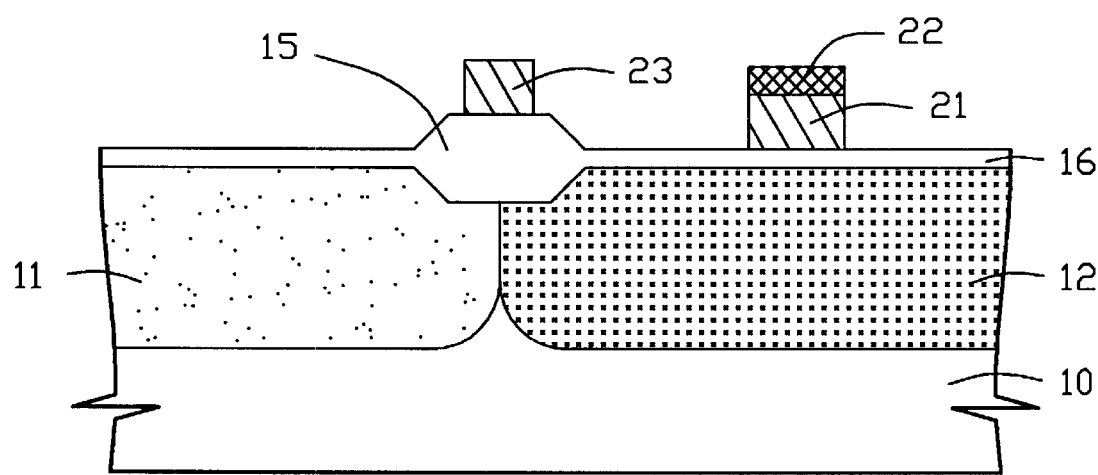

Referring to FIG. 3F, the polysilicon layer 20 is patterned to form a resistor 21 on the N well 12 and a bottom electrode 23 of a capacitor on the isolation region 15. This step comprises depositing a photoresist layer (not shown in the figures) on the diffusion barrier layer 22, patterning the photoresist layer, and etching the diffusion barrier layer 22 and the polysilicon layer 20 using the patterned photoresist layer as a mask.

Figure 3G:
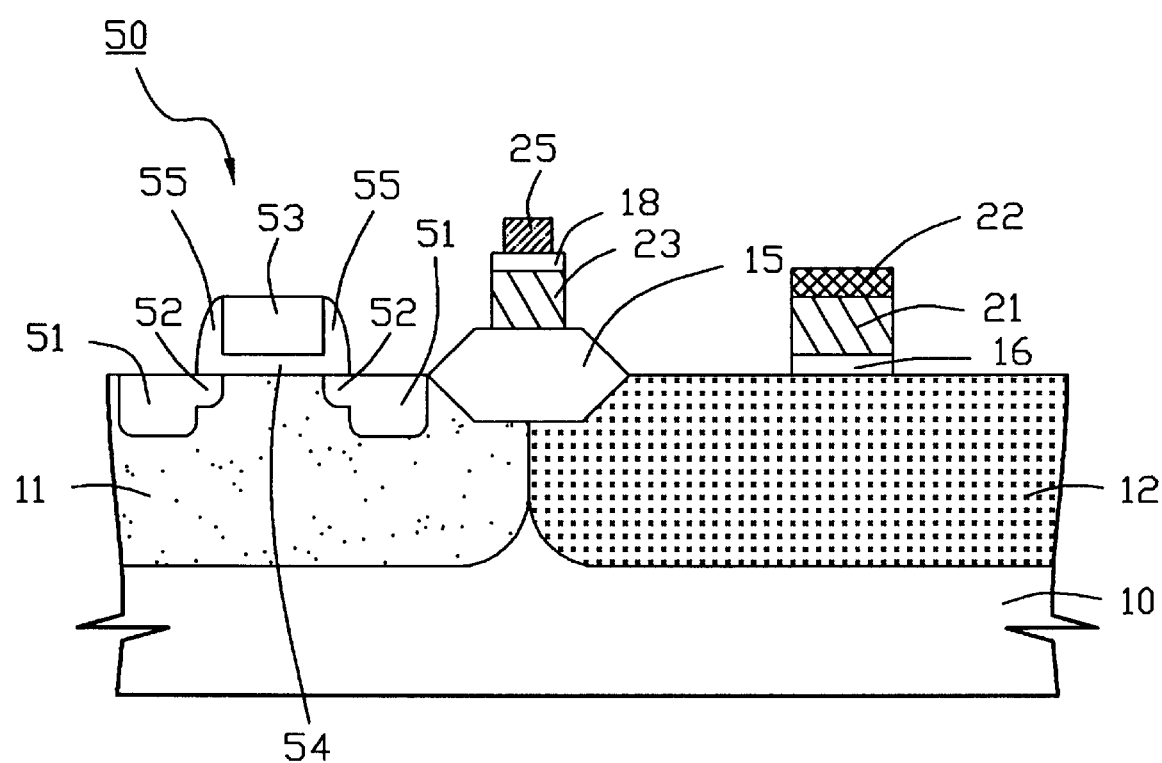

Referring to FIG. 3G, a dielectric layer 18 and a top electrode 25 are sequentially deposited on the bottom electrode 23. The dielectric layer 18 in this invention may be IPO (inter poly oxide), HTO (high temperature oxide), or ONO (oxide/nitride/oxide). The IPO layer is formed by conventional CVD method, such as APCVD, LPCVD, PECVD (plasma enhanced CVD), or HDPCVD (high density plasma CVD). The HTO layer is formed by thermal oxidation using $SiCl_2H_2$ (dichlorinesilane; DCS) and $N_2O$ as precursors at temperature about 800° C. This method of forming dielectric layer can form compact silicon oxide. The ONO layer is a composite layer including a silicon oxide layer, a silicon nitride layer, and a silicon oxide layer sequentially and formed by thermal oxidation and thermal nitridation. Another polysilicon layer is then deposited over the dielectric layer 18 as top electrode of a capacitor by using any conventional deposition method.

Then, a metal-oxide-semiconductor (MOS) transistor 50 is formed in and on the P well 11 by using conventional process. The MOS transistor 50 comprises source/drain regions 51, source/drain extension regions 52, a gate electrode 53, a gate oxide layer 54, and spacers 55.

In accordance with the present invention, a main object of this method is to form an improved high resistance resistor in mixed signal integrated circuit that substantially increases reliability and quality during the formulation of the resistor. It is another object of this invention that the diffusion barrier layer prevents from out-diffusion in annealing step to obtain reliable resistor. It is a further object of this invention that the diffusion barrier layer prevents from over-deepened implantation.

Although specific embodiments have been illustrated and described, it will be obvious to those skilled in the art that various modifications may be made without departing from what is intended to be limited solely by the appended claims.

What is claimed is:

1. A method for forming a high resistance resistor in mixed signal integrated circuits, said method comprising:
    providing a substrate;
    depositing a first polysilicon layer on said substrate;
    performing a surface treatment process by using a plurality of gases to form a diffusion barrier layer on said first polysilicon layer, wherein said gases comprises $N_2O$, $O_2$, NO, and $N_2$, and a thickness of said diffusion barrier layer is about 300 to 500 angstroms;
    ion-implanting into said first polysilicon layer;
    annealing said first polysilicon layer; and
    patterning said first polysilicon layer to form said resistor on said substrate.

2. The method according to claim 1, wherein said surface treatment process uses rapid thermal process.

3. The method according to claim 1, wherein said surface treatment process uses plasma treatment.

4. The method according to claim 1, wherein said diffusion barrier layer comprises amorphous nitride layer.

5. The method according to claim 1, wherein said diffusion barrier layer comprises amorphous oxide layer.

6. The method according to claim 1, wherein said substrate comprises:
    a first well of a first conductivity type formed therein;
    a second well of a second conductivity type formed adjacent to said first well, wherein said second conductivity type is opposite to said first conductivity type; and
    an isolation region formed on said substrate between said first well and said second well.

7. The method according to claim 6, wherein said resistor is on said second well.

8. The method according to claim 6, further comprising a first electrode of a capacitor on said isolation region.

9. The method according to claim 8, further comprising the following steps before said step of annealing said first polysilicon layer to reduce resistance of said first electrode:
    depositing a photoresist layer on a portion of said diffusion barrier layer covering said resistor; and
    ion-implanting into said first polysilicon layer.

10. The method according to claim 8, further comprising the following steps to form mixed signal integrated circuits:
    depositing a dielectric layer on said first electrode;
    depositing a second polysilicon layer on said dielectric layer to accomplish forming said capacitor; and
    forming a metal-oxide-semiconductor transistor in and on said first well.

11. The method according to claim 10, wherein said dielectric layer is selected from the group consisting of silicon oxide, and silicon-oxide/silicon-nitride/silicon-oxide composite layer.

12. A method for forming a high resistance resistor in mixed signal integrated circuits, said method comprising:
    providing a substrate having a first well of a first conductivity type formed therein, a second well of a second conductivity type formed adjacent to said first well, and an isolation region formed on said substrate between said first well and said second well, wherein said second conductivity type is opposite to said first conductivity type;
    depositing a first polysilicon layer on said substrate;
    performing a surface treatment by using a plurality of gases to form a diffusion barrier layer on said first polysilicon layer, wherein said gases comprises $N_2O$, $O_2$, NO, and $N_2$, a temperature of said surface treatment process is about 600° C. to 800° C., a continued heating time of said surface treatment process is about 300 to 600 seconds, and a thickness of said diffusion barrier layer is about 300 to 500 angstroms;
    ion-implanting into said first polysilicon layer;
    annealing said first polysilicon layer; and
    patterning said first polysilicon layer to form said resistor on said second well,
    whereby using said diffusion barrier layer, the ions in said first polysilicon layer will not out-diffuse at said annealing step.

13. The method according to claim 12, wherein said surface treatment process uses rapid thermal process.

14. The method according to claim 12, wherein said surface treatment process uses plasma treatment.

15. The method according to claim 12, wherein said diffusion barrier layer comprises amorphous nitride layer.

16. The method according to claim 12, wherein said diffusion barrier layer comprises amorphous oxide layer.

17. The method according to claim 12, further comprising a first electrode of a capacitor on said isolation region.

18. The method according to claim 17, further comprising the following steps before said step of annealing said first polysilicon layer to reduce resistance of said first electrode:
    depositing a photoresist layer on a portion of said diffusion barrier layer covering said resistor; and
    ion-implanting into said first polysilicon layer.

19. The method according to claim 17, further comprising the following steps to form mixed signal integrated circuits:

depositing a dielectric layer on said first electrode;

depositing a second polysilicon layer on said dielectric layer to accomplish forming said capacitor; and forming a metal-oxide-semiconductor transistor in and on said first well.

20. The method according to claim 19, wherein said dielectric layer is selected from the group consisting of silicon oxide, and silicon-oxide/silicon-nitride/silicon-oxide composite layer.

21. A method for forming mixed signal integrated circuits with improved high resistance resistor, said method comprising:

providing a substrate having a first well of a first conductivity type formed therein, a second well of a second conductivity type formed adjacent to said first well, and an isolation region formed on said substrate between said first well and said second well, wherein said second conductivity type is opposite to said first conductivity type;

depositing a first polysilicon layer on said substrate;

performing a surface treatment by using a plurality of gases to form a diffusion barrier layer on said first polysilicon layer, wherein said gases comprises $N_2O$, $O_2$, $NO$, and $N_2$, a temperature of said surface treatment process is about 600° C. to 800° C., a continued heating time of said surface treatment process is about 300 to 600 seconds, and a thickness of said diffusion barrier layer is about 300 to 500 angstroms;

ion-implanting into said first polysilicon layer, wherein a energy of said ion-implanting process is less than 40 Kev and a dosage of said ion-implanting process is less than 5E15;

annealing said first polysilicon layer;

patterning said first polysilicon layer to form said resistor on said second well and an electrode of a capacitor on said isolation region;

depositing a dielectric layer on said electrode;

depositing a second polysilicon layer on said dielectric layer to accomplish forming said capacitor; and forming a metal-oxide-semiconductor transistor in and on said first well.

22. The method according to claim 21, wherein said surface treatment process uses rapid thermal process.

23. The method according to claim 21, wherein said surface treatment process uses plasma treatment.

24. The method according to claim 21, wherein said diffusion barrier layer comprises amorphous nitride layer.

25. The method according to claim 21, wherein said diffusion barrier layer comprises amorphous oxide layer.

26. The method according to claim 21, further comprising the following steps before said step of annealing said first polysilicon layer to reduce resistance of said first electrode:

depositing a photoresist layer on a portion of said diffusion barrier layer covering said resistor; and ion-implanting into said first polysilicon layer.

27. The method according to claim 21, wherein said dielectric layer is selected from the group consisting of silicon oxide, and silicon-oxide/silicon-nitride/silicon-oxide composite layer.

* * * * *